(12) United States Patent
Kim et al.

(10) Patent No.: US 10,759,462 B2
(45) Date of Patent: Sep. 1, 2020

(54) STEERING WHEEL STRUCTURE FOR CONTROLLING COOLING AND HEATING

(71) Applicant: MI-SEOJIN, INC., Suwon-si (KR)

(72) Inventors: Seo Young Kim, Seoul (KR); Hang Cheol Choi, Seoul (KR); Keun Hee Lee, Suwon-si (KR)

(73) Assignee: MI-SEOJIN, INC., Suwon-si (KR)

( * ) Notice: Subject to any disclaimer, the term of this patent is extended or adjusted under 35 U.S.C. 154(b) by 0 days.

(21) Appl. No.: 16/085,076

(22) PCT Filed: Mar. 14, 2017

(86) PCT No.: PCT/KR2017/002705
§ 371 (c)(1),
(2) Date: Sep. 14, 2018

(87) PCT Pub. No.: WO2017/160043
PCT Pub. Date: Sep. 21, 2017

(65) Prior Publication Data
US 2019/0084608 A1    Mar. 21, 2019

(30) Foreign Application Priority Data
Mar. 14, 2016 (KR) .................. 10-2016-0030414

(51) Int. Cl.
*B62D 1/06* (2006.01)
*F25B 21/04* (2006.01)
*H01L 35/28* (2006.01)

(52) U.S. Cl.
CPC .............. *B62D 1/065* (2013.01); *F25B 21/04* (2013.01); *H01L 35/28* (2013.01); *F25B 2321/023* (2013.01)

(58) Field of Classification Search
CPC ...... B62D 1/065; B62D 1/06; B60H 1/00292; B60H 1/00478
See application file for complete search history.

(56) References Cited

U.S. PATENT DOCUMENTS

| 4,640,340 A | 2/1987 | Noda et al. | |
| 2004/0168540 A1* | 9/2004 | Weiss ..................... | B62D 1/065 74/552 |
| 2010/0071502 A1* | 3/2010 | Yasuda ................. | B62D 1/065 74/552 |

FOREIGN PATENT DOCUMENTS

| JP | 60-088679 | 5/1985 |
| JP | 2002347629 A * | 12/2002 |

(Continued)

OTHER PUBLICATIONS

International Search Report dated Jul. 11, 2017, in International Patent Application No. PCT/KR2017/002705 (with English Translation).

*Primary Examiner* — Luis A Gonzalez
(74) *Attorney, Agent, or Firm* — H.C. Park & Associates, PLC

(57) ABSTRACT

A steering wheel structure configured to control cooling and heating, the steering wheel structure including: an inner layer forming a rim of the steering wheel; and an outer layer surrounding at least a part of the inner layer; wherein the outer layer including, an outer circumferential part forming at least a part of outer circumference of the outer layer; at least one gap disconnecting the outer circumferential part; and a cold-hot adjusting part formed in the at least one gap; wherein the cold-hot adjusting part has a lower heat capacity and a higher thermal conductivity than the outer circumferential forming part.

6 Claims, 6 Drawing Sheets

(56) References Cited

FOREIGN PATENT DOCUMENTS

| JP | 2004291889 A | * | 10/2004 | |
|---|---|---|---|---|
| JP | 2006176037 A | * | 7/2006 | ............. B62D 1/065 |
| JP | 2007153026 A | * | 6/2007 | ......... B60H 1/00292 |
| JP | 2007261559 A | * | 10/2007 | |
| JP | 2008-120353 | | 5/2008 | |
| JP | 2015-003698 | | 1/2015 | |
| KR | 10-2011-0002759 | | 1/2011 | |
| KR | 10-2014-0123336 | | 10/2014 | |
| KR | 10-2014-0131055 | | 11/2014 | |

\* cited by examiner

STEERING WHEEL STRUCTURE FOR CONTROLLING COOLING AND HEATING

CROSS-REFERENCE TO RELATED APPLICATION

This application is the National Stage Entry of International Patent Application No. PCT/KR2017/002705, filed on Mar. 14, 2017, and claims priority from and the benefit of Korean Patent Application No. 10-2016-0030414, filed on Mar. 14, 2016, all of which are hereby incorporated by reference for all purposes as if set forth herein.

BACKGROUND

Field

Exemplary embodiments of the present invention relates to a steering wheel structure capable of controlling cooling and heating, and more particularly, to a steering wheel structure capable of cooling or heating only a part of a steering wheel, so temperature control performance can be improved.

Discussion of the Background

Many attempts have been made to allow the steering wheel for steering the vehicle to be cooled or heated so as to managing it's temperature as necessary, which is installed on the front of the driver's seat.

Such attempts has been disclosed in Korean Patent Publication (application No. 10-2013-0049890, "Heating and cooling system for steering wheel of vehicle"), Korean Patent Publication (publication No. 10-2014-0123336, "TEMPERATURE CONTROL POSSIBLE STEERING WHEEL FOR VEHICLE").

As described in the above-mentioned prior art, thermoelectric elements (thermoelectric modules) are generally used for temperature control.

However, there is a problem in that, in order to cool or heat the entire steering wheel having a relatively large heat capacity through the thermoelectric module as in the prior art, it takes a long time due to the cooling performance or the heating performance of the thermoelectric module.

That is, the steering wheel heated to a high temperature or the steering wheel cooled to a low temperature must be able to cool or heat in a relatively short period of time. However, such a performance has not been commercialized through such attempts. Especially, in the case of cooling, it is not enough to be commercialized.

For example, the steering wheel of a vehicle may be heated to 90° C. or more depending on the external environment. However, it takes several tens of minutes to cool the entire steering wheel composed of a material having a relatively large heat capacity, so It is true that it's very insufficient to be commercialized.

SUMMARY

Accordingly, it is an object of the present invention to providing a technical concept that enables the steering wheel to be operated without inconvenience in a relatively short period of time by replacing a portion of outer layer part of steering wheel having relatively large heat capacity with cold-hot adjusting part having a relatively small heat capacity, concentrating cooling and heating the replaced cold-hot adjusting part, and making driver gripping the cold-hot adjusting part.

According to an aspect of an exemplary embodiment, a steering wheel structure capable of controlling cooling and heating comprises, an inner layer forming a rim of the steering wheel and an outer layer part surrounding at least a part of the inner layer, wherein the outer layer part comprising, an outer circumferential forming part forming part of outer circumference of the outer layer part and including at least one disconnected gap and a cold-hot adjusting part formed in the gap, wherein the cold-hot adjusting part has a lower heat capacity and higher thermal conductivity than the outer circumferential forming part.

In an embodiment of the steering wheel structure, the cold-hot adjusting part is formed in the gap so that a predetermined space is formed between the cold-hot adjusting part and the inner layer.

In an embodiment of the steering wheel structure, the outer circumferential forming part may comprise a first protrusion and a second protrusion, each of the first protrusion and the second protrusion is a inner layer side part of the outer circumferential forming part and protrudes in the direction of the gap, and wherein the cold-hot adjusting part is formed on the upper surface of the first protrusion and the second protrusion, so that the space is formed.

In an embodiment, the steering wheel structure may further comprise a thermoelectric module attached to the inner side of the cold-hot adjusting part.

In an embodiment, a support for supporting the cold-hot adjusting part is formed in the space and the support may have a wave shape to reduce the contact area with the cold-hot adjusting part.

In an embodiment, the gap is formed to include at least a portion of a connection region where the rim and a spoke part of the steering wheel are connected.

In an embodiment, the steering wheel structure may further comprise a thermoelectric module provided at a hub or a spoke part of the steering wheel; and a heat transfer medium connecting the thermoelectric module and the cold-hot adjusting part.

In an another embodiment of present invention, a steering wheel structure capable of controlling cooling and heating comprises; an outer circumferential forming part forming a part of outer circumference of the rim of the steering wheel; and a cold-hot adjusting part forming a remaining part of outer circumference of the rim, wherein the cold-hot adjusting part has a lower heat capacity and higher thermal conductivity than the outer circumferential forming part.

In the other embodiment of present invention, a steering wheel structure capable of controlling cooling and heating comprises; a cold-hot adjusting part formed in at least one disconnected gap of a outer circumferential forming part including the at least one disconnected gap, wherein the outer circumferential forming part forming part of outer circumference of a outer layer surrounding at least a part of a inner layer forming the rim of the steering wheel, a thermoelectric module for controlling the temperature of cold-hot adjusting part, wherein the thermoelectric module is attached to a space side of cold-hot adjusting part wherein the space formed between the cold-hot adjusting part and the inner layer, or is provided at a hub or a spoke part of the steering wheel and connecting the cold-hot adjusting part by a heat transfer medium.

According to the technical concept of the present invention, a part of the outer layer portion of the steering wheel having a large heat capacity is replaced with a cold-hot adjusting part having a relatively small heat capacity, and the replaced cold-hot adjusting part is cooled or heated intensively, so It is possible to control the temperature of cold-hot adjusting part in a relatively short time. Further, by allowing the driver to grip the cold-hot adjusting part, the driving operation can be started in a relatively short time.

DESCRIPTION OF THE DRAWINGS

The accompanying drawings, which are included to provide a further understanding of the inventive concept, and are incorporated in and constitute a part of this specification illustrate exemplary embodiments of the inventive concept, and, together with the description, serve the explain principles of the inventive concept.

DETAILED DESCRIPTION

Figure 1:
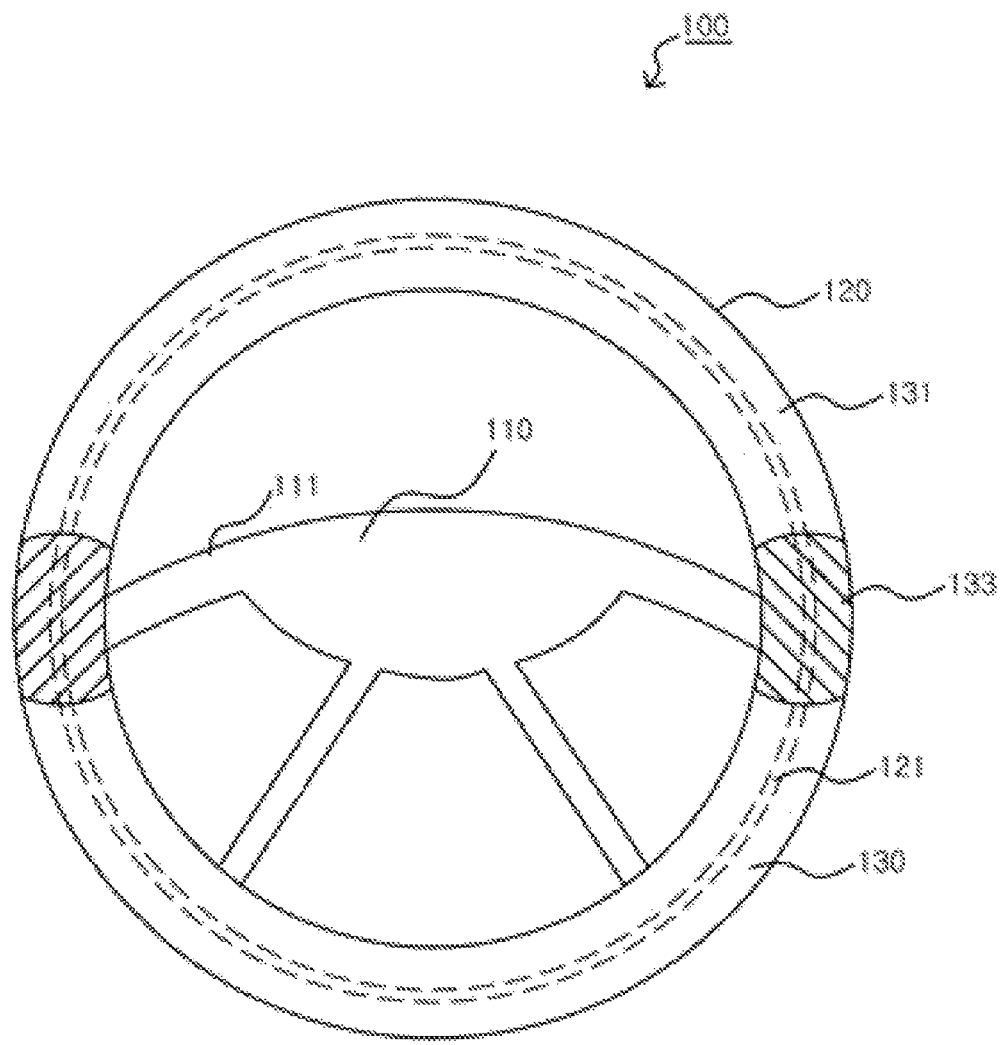
FIG. 1 shows a schematic configuration of a steering wheel structure according to an embodiment of the present invention.

In order to fully understand the present invention, the operational advantages of the present invention, and the objects attained by the practice of the present invention, reference should be made to the accompanying drawings and context of the accompanying drawings which illustrate preferred embodiments of the present invention.

The terminology used herein is for the purpose of describing particular embodiments only and is not intended to be limiting of the invention. The singular forms "a," "an," and "the" include plural referents unless the context clearly dictates otherwise.

Also, in this specification, terms such as "comprises" or "having" are used to designate the presence of stated features, numbers, steps, operations, elements, components, or combinations thereof, it do not preclude the presence or addition of other features, numbers, steps, operations, components, parts, or combinations thereof.

Hereinafter, embodiments of the present invention will be described in detail with reference to the accompanying drawings. Like reference symbols in the drawings denote like elements.

Figure 2:
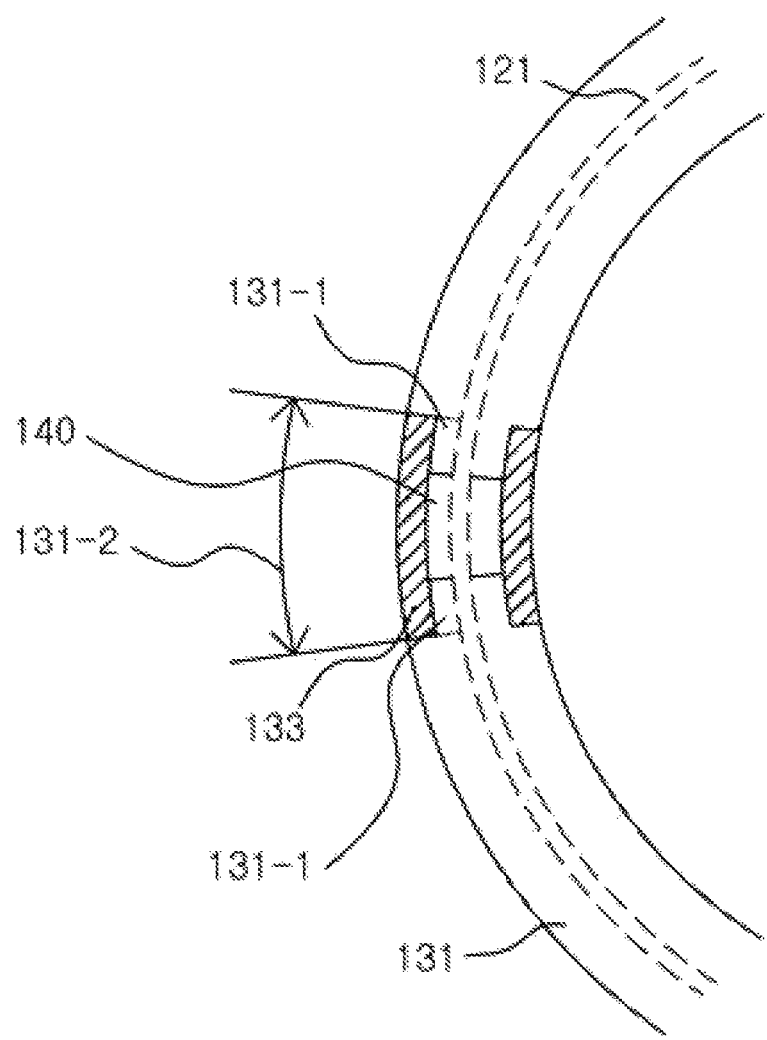
FIG. 2 and FIG. 3 are sectional drawings illustrating an embodiment of a cold-hot adjusting part according to an embodiment of the present invention
Figure 3:
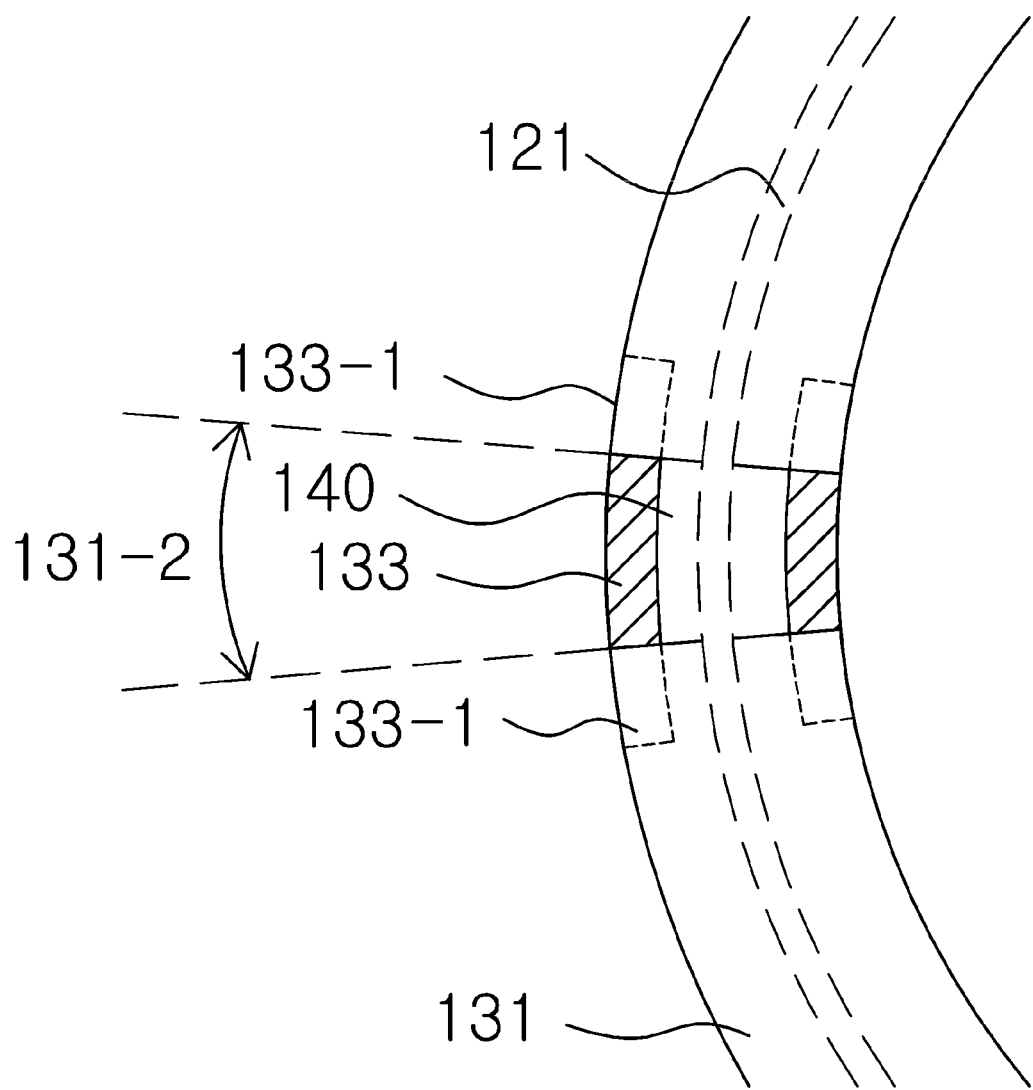
Figure 4:
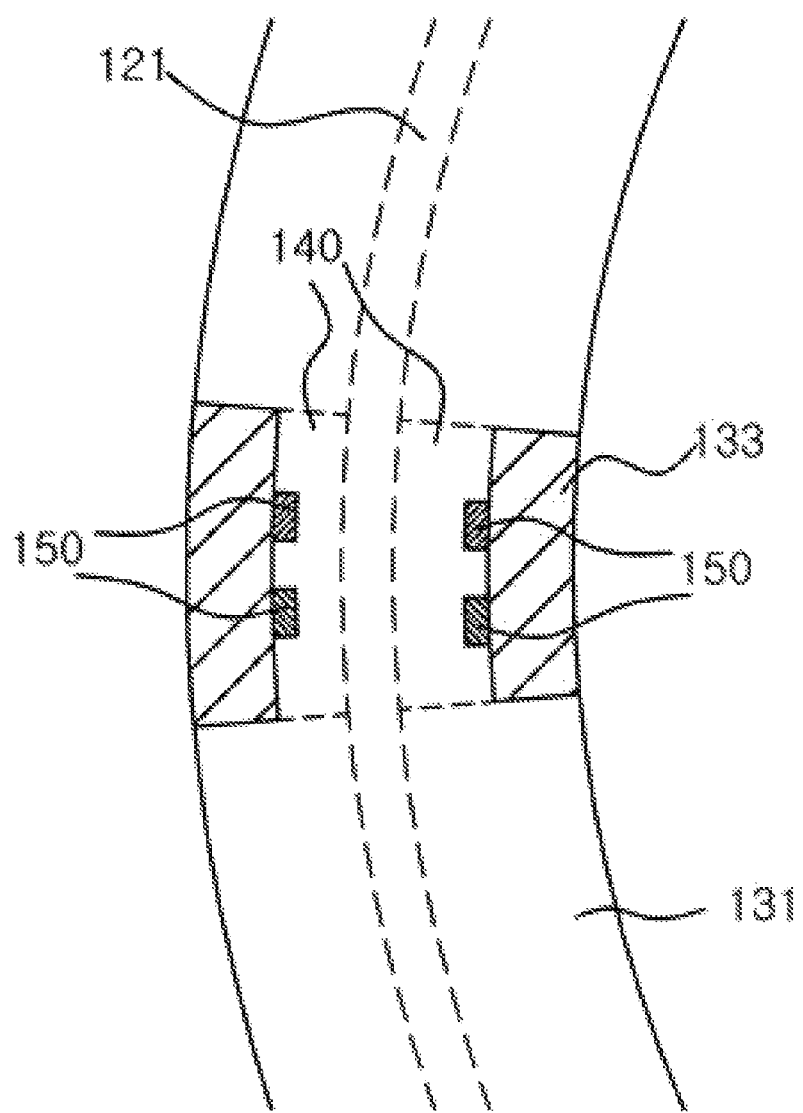
FIG. 4 is a sectional drawing illustrating an installation example of the thermoelectric module according to the embodiment of the present invention.
Figure 5:
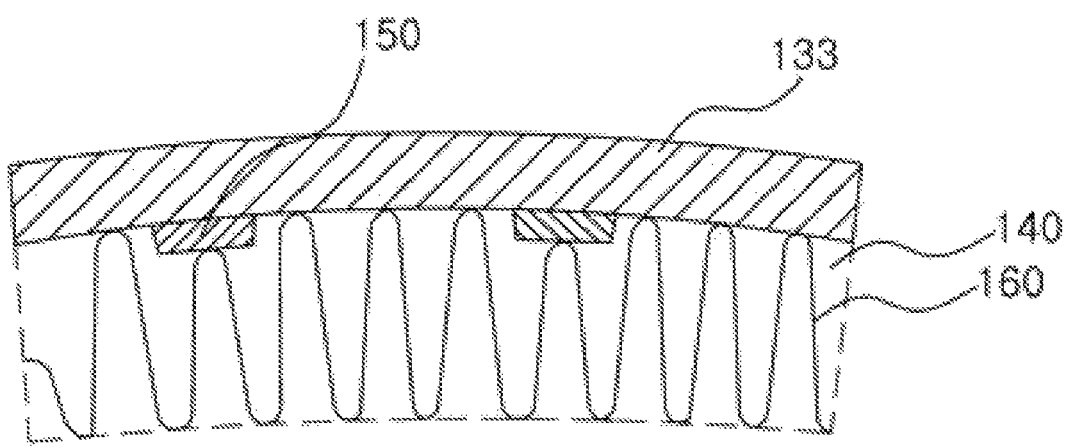
FIG. 5 is a sectional diagram for explaining a support for supporting the cold-hot adjusting part according to the embodiment of the present invention.
Figure 6:
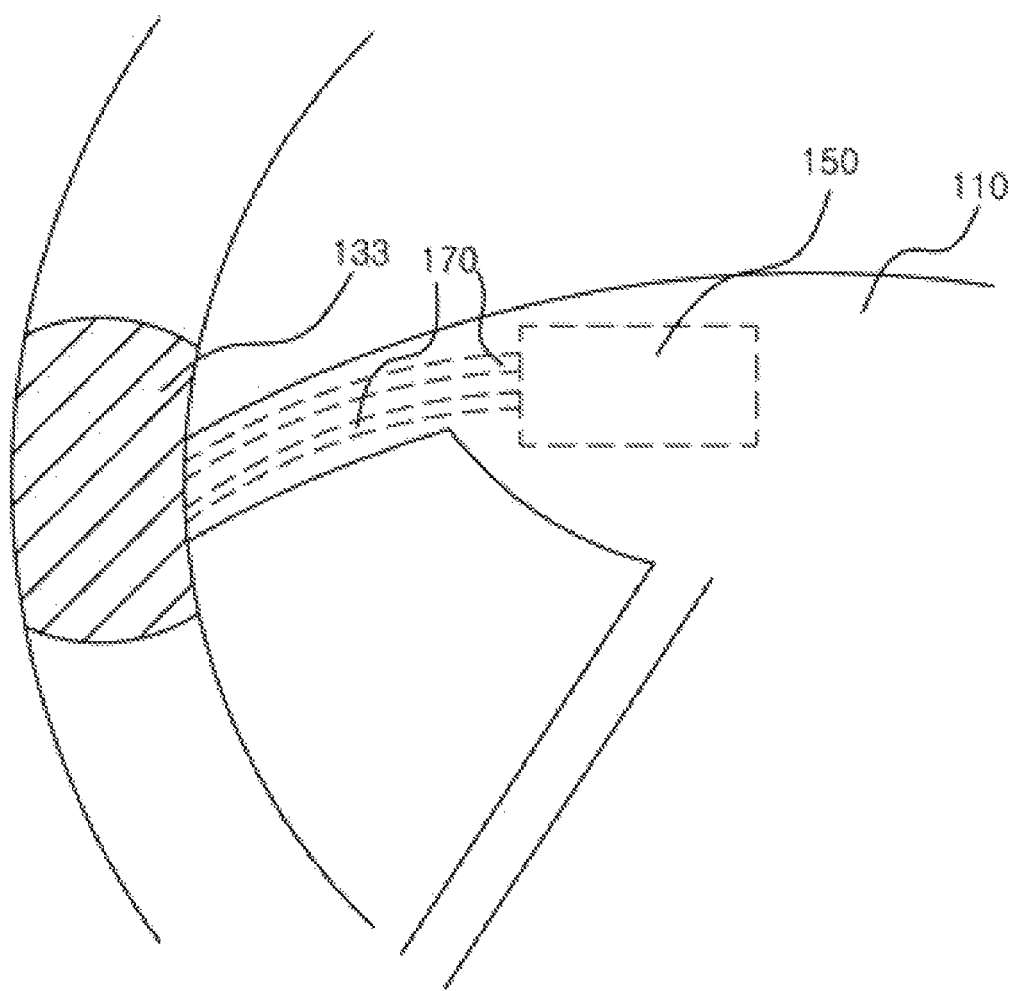
FIG. 6 shows an another installation example of the thermoelectric module according to the embodiment of the present invention.

FIG. 1 shows a schematic configuration of a steering wheel structure according to an embodiment of the present invention. Also FIG. 2 and FIG. 3 are sectional drawings illustrating an embodiment of a cold-hot adjusting part according to an embodiment of the present invention, FIG. 4 is a sectional drawing illustrating an installation example of the thermoelectric module according to the embodiment of the present invention. And FIG. 5 is a sectional diagram for explaining a support for supporting the cold-hot adjusting part according to the embodiment of the present invention, FIG. 6 shows an another installation example of the thermoelectric module according to the embodiment of the present invention.

First, referring to FIG. 1, a steering wheel 100 according to an embodiment of the present invention includes a hub 110, a spoke part 111, and a rim 120. The hub 110 is connected to the steering shaft, and can be implemented to reduce a driver's injury during a collision. The rim 120 may be configured to allow the driver to grasp to rotate the steering shaft. The spoke part 111 may be configured to connect the hub 110 and the rim 120.

The rim 120 may include an inner layer 121 and an outer layer part 130 surrounding at least a portion of the inner layer 121.

The inner layer 121 may be, for example, a core forming a skeleton of the rim 120. In this case, the outer layer part 130 may be formed to surround the core. In this case, the outer layer part 130 may be implemented as a single layer, but may be composed of a plurality of layers made of different materials as described above. The core may be embodied as a material having a relatively high physical strength, such as magnesium, and a relatively low thermal conductivity. However, according to the embodiment, as shown in the prior art, a heat sink or various materials may be used as needed.

When the rim 120 is composed of a plurality of layers, the inner layer 121 may be any one of a plurality of layers other than a core. In this case, the outer layer part 130 may be a layer surrounding the inner layer 121 and formed outside the inner layer 121.

In any case, the outer layer part 130 may be a configuration, a part of which is replaced with a cold-hot adjusting part as described below, to which the technical idea of the present invention is applied. Also, the outer layer part 130 may be configured to form the rim 120 and to directly or indirectly surround the core of the rim 120. The outer layer part 130 may be formed to surround only a part of the inner layer 121 according to an embodiment.

The outer layer part 130 of the present invention may include an outer circumferential forming part 131 and a cold-hot adjusting part 133. That is, unlike the conventional method in which the outer layer 130 is formed such that the same material is wrapped around the inner layer 121 along its outer circumference (or surroundings), according to the technical idea of the present invention outer circumferential forming part 131 and cold-hot adjusting part 133 are configured by different materials and may form the outer circumference of the outer layer part 130.

For example, as shown in FIG. 1, the outer layer part 130 includes outer circumferential forming part 131 surrounding a part of the inner layer 121 and cold-hot adjusting part 133 surrounding a remain part of the inner layer 121.

That means, the outer circumferential forming part 131 is formed to surround the inner layer 121, at least one disconnected a gap is formed at the outer circumferential forming part 131 to be formed cold-hot adjusting part 133.

This means that according to the technical idea of the present invention, a certain region (the gap) in the circumferential direction of the outer layer part 130 is replaced with a material different from the other regions, as compared with a conventional outer layer all of which formed with the same material.

For example, the outer circumferential forming part 131 may be embodied by polyurethane, wood grain, real wood or the like having a relatively large heat capacity like a conventional steering wheel. The cold-hot adjusting part 133 may be embodied by a material having a smaller heat capacity and higher thermal conductivity than the outer circumferential forming part 131 for example, aluminum.

As a result, the technical concept of the present invention is not cooling or heating the entire rim 120 of the steering wheel 100, but the temperature of cold-hot adjusting part 133 is controlled intensively by providing cold-hot adjusting part 133 capable of performing cooling or heating in relatively short time in predetermined region of the outer layer part 130 included in the rim 120.

This is because the area in which the user grasps the steering wheel 100 for driving is a part of the steering wheel 100 rather than the entire area thereof. So by heating or cooling only the part of the steering wheel 100, there is an effect that it is possible to provide an area (i.e., an area corresponding to the cold-hot adjusting part 133) that can be grasped by the driver in relatively short time even if the external environment is hot or cold.

The outer layer part 130 may be the outermost layer of the rim 120. However, if necessary, a predetermined layer may be further formed on the outer periphery of the outer layer part 130. However, it may be desirable that the layer formed on the outer periphery of the outer layer part 130 may have a low heat capacity or a high thermal conductivity. If necessary, a layer with a predetermined material may be optionally coated or may be additionally formed on the outer surface of the cold-hot adjusting part 133.

As shown in FIG. 2, the cold-hot adjusting part 133 is disposed at the outer circumferential forming part 131, that is the cold-hot adjusting part 133 is formed in the gap 131-2 which is disconnected space of the material constituting the outer circumferential forming part 131.

Further, a predetermined space 140 may be formed between the cold-hot adjusting part 133 and the inner layer 121. The cold-hot adjusting part 133 may be formed in the gap 131-2 in a predetermined manner so that the space 140 is formed.

By forming the space 140 there is effect that the cold-hot adjusting part 133 is thermally isolated with the inner layer 121 as much as possible. Also, as shown in FIG. 4, at least one thermoelectric module 150 can be directly attached to the inner side of cold-hot adjusting part 133. Even when the thermoelectric module 150 is mounted on the spoke part 111 or the hub 110 as described later, there is effect that an installation space for the heat transfer medium (for example, a heat pipe) that thermally connects the cold-hot adjusting part 133 and the thermoelectric module 150 can be provided.

As shown in FIG. 2, in order to form the space 140 the outer circumferential forming part 131 may include protrusion 131-1 which is a inner layer 121 side portion of outer circumferential forming part 131 and is protruded in the direction of the gap 131-2.

For example, as shown in FIG. 2, the outer circumferential forming part 131 may include a first protrusion and a second protrusion that are facing opposed direction to each other, and the cold-hot adjusting part 133 may be disposed on each upper surface of the first protrusion and the second protrusion, so the space 140 can be formed.

Further, according to another embodiment, as shown in FIG. 3, the protrusion 131-1 may not be formed in the gap 131-2, but a part 133-1 of the cold-hot adjusting part 133 is inserted in upper side of the outer circumferential forming part 131, so that the space 140 may be formed.

There is obvious that the space 140 may be formed between the inner layer 121 and the cold-hot adjusting part 133 in various other ways.

Meanwhile, when the space 140 is formed as shown in FIG. 5, a support 160 for physically supporting the cold-hot adjusting part 133 may be provided. The support 160 may be implemented in a predetermined manner to support a pressure applied to the inside from the outside of the cold-hot adjusting part 133 (e.g., a pressure when the driver grips the cold-hot adjusting part 133).

According to one example, as shown in FIG. 5, the support 160 150 may be formed in a wave shape to reduce the contact surface with the inner layer 121 as much as possible with supporting the cold-hot adjusting part 133 (and/or the thermoelectric module 150 when the thermoelectric module 150 is attached to the inner side of the cold-hot adjusting part 133), Further, it is desirable that the support 160 may be embodied with a material having low thermal conductivity to enhance the thermal insulation effect between the inner layer 121 and the cold-hot adjusting part 133 (or the thermoelectric module 150).

Meanwhile, the gap 131-2 may include all or a portion of a region (connection region) where the rim 120 and the spoke part 111 are connected to each other. In general, the connection area where the spoke part 111 and the rim 120 are connected is an area mainly grasped by the driver and instruments (e.g., a wiper operating instruments, a headlight operating instruments, or the like) to be operated by the driver is mainly disposed around the connection area. So when the gap 131-2 is formed to include the connections region or is formed around the connection region and the cold-hot adjusting part 133 is formed in the gap 131-2, there is an effect that the convenience of the driver is enhanced.

And as shown in FIG. 6, even when the thermoelectric module 150 is installed in the hub 110 (or installed in the spoke part 111) and the cold-hot adjusting part 133 and the thermoelectric module 150 are thermally connected through he at least one heat transfer medium 170, the heat transfer medium 170 can be installed inside the lid covering the spoke part 111 along the spoke part 111, so that the heat transfer medium 170 can be prevented from projecting to the outside.

While the present invention has been particularly shown and described with reference to exemplary embodiments thereof, it is evident that many alternatives, modifications and variations will be apparent to those skilled in the art. Accordingly, the true scope of the present invention should be determined by the technical idea of the appended claims.

The invention claimed is:

1. A steering wheel structure configured to control cooling and heating, the steering wheel structure comprising:
   an inner layer forming a rim of the steering wheel; and
   an outer layer surrounding at least a part of the inner layer, the outer layer comprising,
      an outer circumferential part forming at least a part of outer circumference of the outer layer;
      at least one gap disconnecting the outer circumferential part; and
      a cold-hot adjusting part formed in the at least one gap; and
   a predetermined space formed between the cold-hot adjusting part and the inner layer in the at least one gap;
   wherein the cold-hot adjusting part has a lower heat capacity and a higher thermal conductivity than the outer circumferential part,
   wherein the outer circumferential part comprises a first protrusion and a second protrusion, each of the first protrusion and the second protrusion protruding towards the inner layer in the direction of the gap, and
   wherein the cold-hot adjusting part is formed on the first protrusion and the second protrusion, so that the predetermined space is formed.

2. The steering wheel structure of claim 1, further comprising a thermoelectric module attached to the inner side of the cold-hot adjusting part.

3. The steering wheel structure of claim 1, further comprising a support supporting the cold-hot adjusting part disposed in the predetermined space.

4. The steering wheel structure of claim 3, wherein the support has a wave shape to reduce the contact area with the cold-hot adjusting part.

5. The steering wheel structure of claim 1, further comprising a spoke part,
   wherein the gap is formed to include at least a portion of a connection region where the rim and a spoke part are connected.

6. The steering wheel structure of claim 1, further comprising:
   a spoke part and a hub;
   a thermoelectric module provided at the hub or the spoke; and
   a heat transfer medium connecting the thermoelectric module and the cold-hot adjusting part.

\* \* \* \* \*